(12) United States Patent
Bolom et al.

(10) Patent No.: US 7,671,362 B2
(45) Date of Patent: Mar. 2, 2010

(54) TEST STRUCTURE FOR DETERMINING OPTIMAL SEED AND LINER LAYER THICKNESSES FOR DUAL DAMASCENE PROCESSING

(75) Inventors: Tibor Bolom, Fishkill, NY (US); Kaushik Chanda, Fishkill, NY (US); Ronald G. Filippi, Wappingers Falls, NY (US); Stephan Grunow, Wappingers Falls, NY (US); Paul S. McLaughlin, Poughkeepsie, NY (US); Sujatha Sankaran, New Paltz, NY (US); Andrew H. Simon, Fishkill, NY (US); Theodorus E. Standaert, Pine Bush, NY (US); James Werking, Hopewell Junction, NY (US)

(73) Assignees: International Business Machines Corporation, Armonk, NY (US); Advanced Micro Devices, Inc. (AMD), Sunnyvale, CA (US)

( * ) Notice: Subject to any disclaimer, the term of this patent is extended or adjusted under 35 U.S.C. 154(b) by 0 days.

(21) Appl. No.: 11/953,568

(22) Filed: Dec. 10, 2007

(65) Prior Publication Data

US 2009/0146143 A1   Jun. 11, 2009

(51) Int. Cl.
    *H01L 23/58* (2006.01)
(52) U.S. Cl. .......................... 257/48; 438/14

(58) Field of Classification Search ............ 257/48, 257/E21.521–E21.531; 428/14; 324/512–769
See application file for complete search history.

(56) References Cited

U.S. PATENT DOCUMENTS

| | | | |
|---|---|---|---|
| 5,239,270 A | 8/1993 | Desbiens | |
| 5,264,377 A | 11/1993 | Chesire et al. | |
| 6,677,170 B1 | 1/2004 | Markle | |
| 6,747,445 B2 | 6/2004 | Fetterman et al. | |
| 6,858,511 B1 | 2/2005 | Marathe | |
| 6,897,475 B2 * | 5/2005 | Wang | 257/48 |
| 6,939,726 B2 | 9/2005 | Hsu et al. | |
| 7,026,175 B2 | 4/2006 | Li et al. | |
| 2003/0080761 A1 | 5/2003 | Filippi, Jr. et al. | |
| 2007/0115018 A1 | 5/2007 | Chanda et al. | |

* cited by examiner

*Primary Examiner*—Ha Tran T Nguyen
*Assistant Examiner*—Shaun Campbell
(74) *Attorney, Agent, or Firm*—Cantor Colburn LLP; Wenjie Li

(57) ABSTRACT

A test structure for integrated circuit (IC) device fabrication includes a plurality of test structure chains formed at various regions of an IC wafer, each of the plurality of test structure chains including one or more vias; each of the one or more vias in contact with a conductive line disposed thereabove, the conductive line being configured such that at least one dimension thereof varies from chain to chain so as to produce variations in seed layer and liner layer thickness from chain to chain for the same deposition process conditions.

7 Claims, 7 Drawing Sheets

TEST STRUCTURE FOR DETERMINING OPTIMAL SEED AND LINER LAYER THICKNESSES FOR DUAL DAMASCENE PROCESSING

BACKGROUND

The present invention relates generally to the manufacture and testing of integrated circuit (IC) devices and, more particularly, to a test structure for determining optimal seed and liner layer thicknesses for dual damascene processing.

The reliability of copper (Cu) interconnects in IC devices is typically limited by failure mechanisms such as electromigration and stress migration, for example. In electromigration, Cu atoms migrate in the direction of the electron flow, eventually causing a void in the Cu lines. In stress migration, Cu atoms diffuse to relieve the thermal stress caused by the mismatch in the coefficient of thermal expansion (CTE) between the Cu and the surrounding dielectric material. In this case, void formation is also possible if sufficient vacancies are available. For dual damascene processing, in which both vias and lines are formed in the same processing step, liner materials are used for improved yield and reliability. Thus, where voids happen to be present in the Cu vias and/or lines, an open circuit may be prevented by maintaining a current path through the conductive liners. The same failure mechanisms are known to occur in aluminum (Al), gold (Au) and silver (Ag) interconnects.

Typically, such liner materials include, for example, tantalum (Ta), tantalum nitride (TaN), titanium (Ti), titanium nitride (TiN) and tungsten (W). Since these materials are significantly more resistive than Cu, the liner thickness is chosen such that the line resistance is not severely degraded. For electroplated Cu, a seed layer must be deposited into the via and line openings following liner deposition. The Cu seed is typically deposited by, for example, physical vapor deposition (PVD) prior to the plating process. The seed must be thick enough to ensure that a continuous layer forms over the entire wafer. Problems arise if the liner is made too thick, as the metal fill may be adversely affected if the openings are pinched off at the top of the vias and lines. Similar problems may occur if the Cu seed layer is too thick. Therefore, it is beneficial to have an optimized thickness of the Cu seed and liner such that both process and reliability improvements are possible.

SUMMARY

The foregoing discussed drawbacks and deficiencies of the prior art are overcome or alleviated, in an exemplary embodiment, by a test structure for integrated circuit (IC) device fabrication, the structure including a plurality of test structure chains formed at various regions of an IC wafer, each of the plurality of test structure chains including one or more vias; each of the one or more vias in contact with a conductive line disposed thereabove, the conductive line being configured such that at least one dimension thereof varies from chain to chain so as to produce variations in seed layer and liner layer thickness from chain to chain for the same deposition process conditions.

In another embodiment, a method of forming test structure for integrated circuit (IC) device fabrication, the method including forming a plurality of test structure chains formed at various regions of an IC wafer, each of the plurality of test structure chains including one or more vias; and forming each of the one or more vias in contact with a conductive line disposed thereabove, the conductive line being configured such that at least one dimension thereof varies from chain to chain so as to produce variations in seed layer and liner layer thickness from chain to chain for the same deposition process conditions.

BRIEF DESCRIPTION OF THE DRAWINGS

Referring to the exemplary drawings wherein like elements are numbered alike in the several Figures.

DETAILED DESCRIPTION

When looking at the copper seed and liner thickness for a given technology, a primary focus is on finding the optimal thickness. It would be desirable to project what the optimal thicknesses will be for future technologies in order to save development resources used in trying to determine these variables. If the seed or liners are too thick, there may be resistivity problems; on the other hand, there are reliability problems if the layers are too thin. As such, it would be extremely beneficial to design a structure that could be used for determining the optimum thicknesses for a given process.

Accordingly, disclosed herein is a test structure for determining optimal seed and liner layer thicknesses for dual damascene processing. However, rather than obtaining different Cu seed and liner thicknesses by varying the deposition conditions on different wafers, the test structure is designed in such a way so that different thicknesses are obtained in various regions of the test structure for the same nominal deposition conditions. Moreover, the disclosed test structure embodiments may be used for stress migration testing, as well as an in-line monitor for determining the optimum layer thicknesses.

Figure 1:
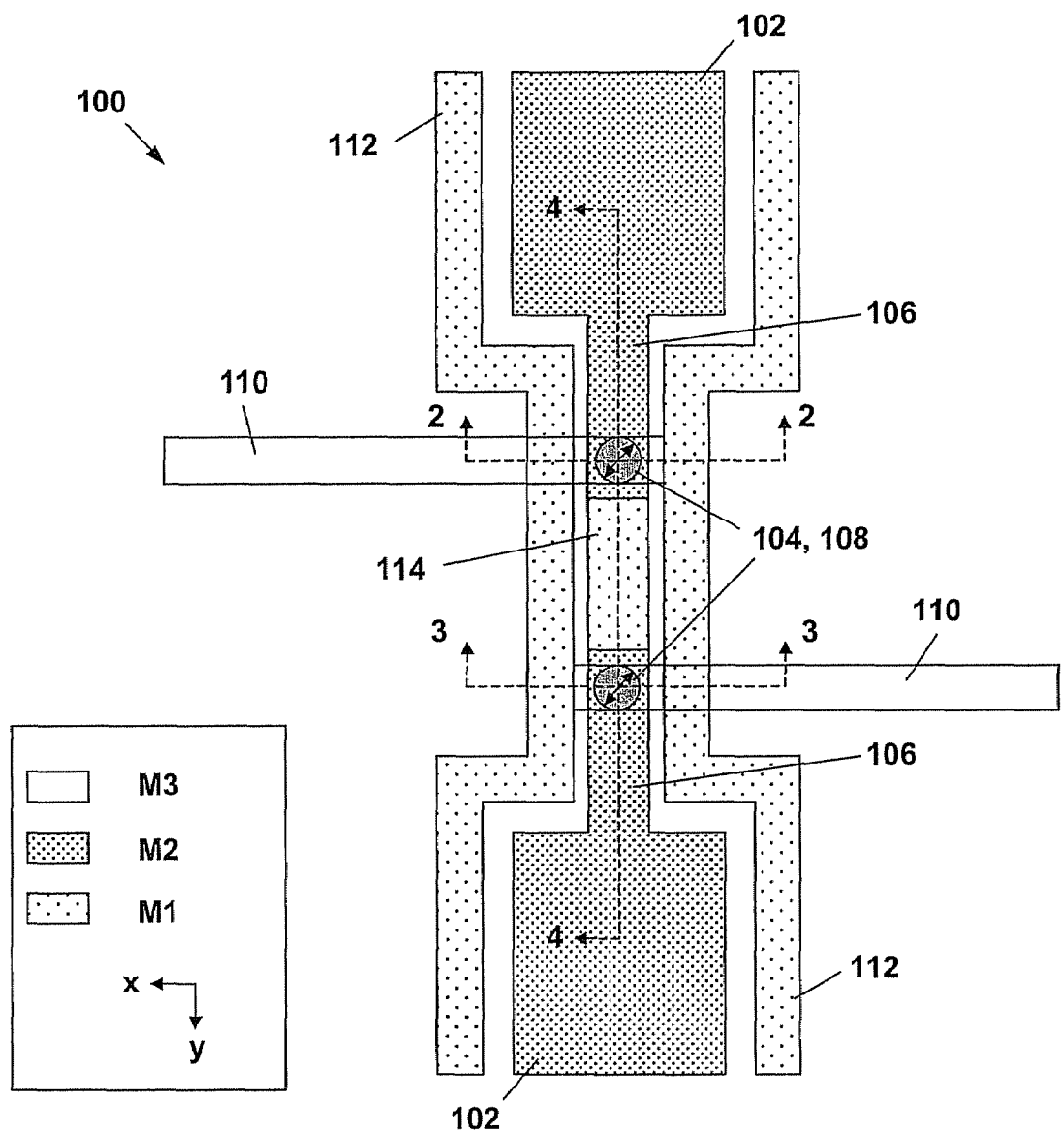
FIG. 1 is a schematic top view of a test structure for determining optimal seed and liner layer thicknesses for dual damascene processing, in accordance with an embodiment of the invention.
Figure 2:
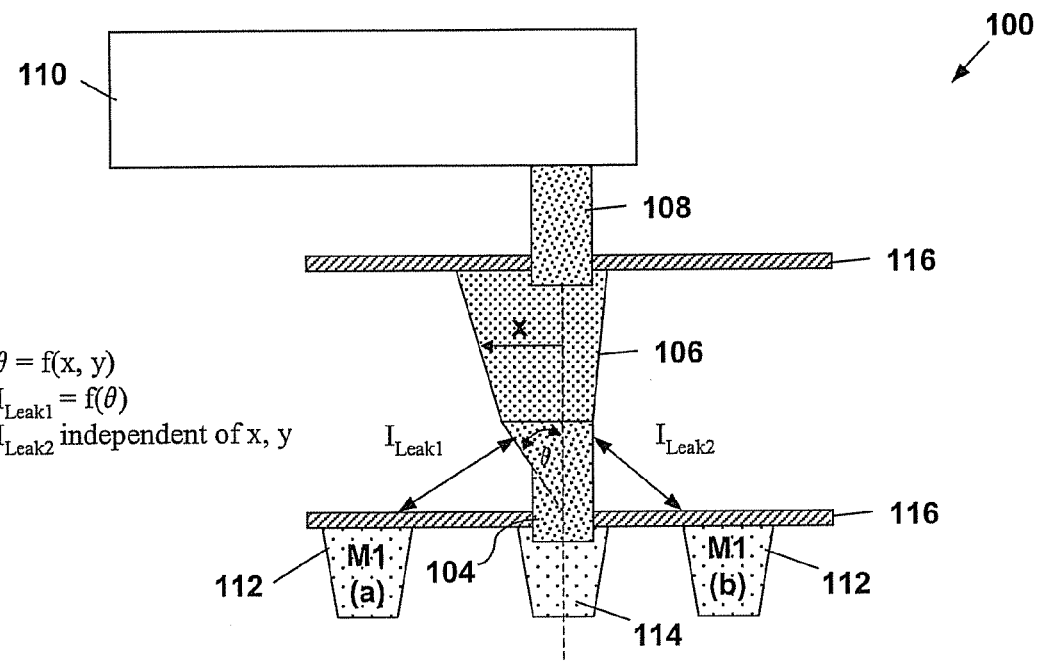
FIG. 2 is a schematic cross-sectional view of the test structure of FIG. 1, taken along the lines 2-2.
Figure 3:
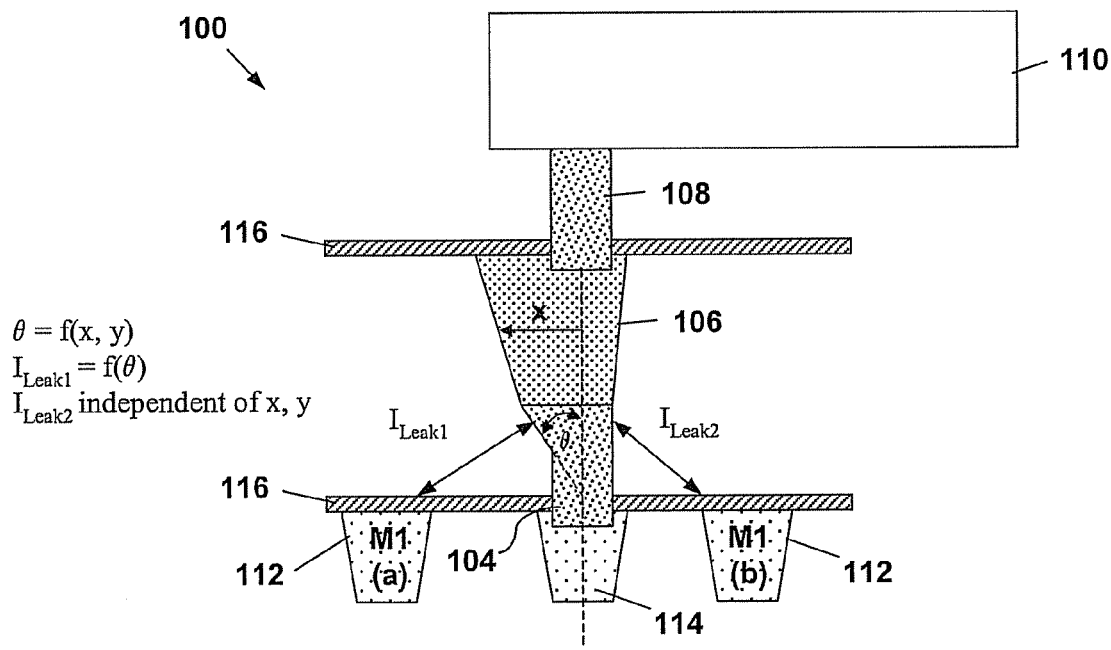
FIG. 3 is another schematic cross-sectional view of the test structure of FIG. 1, taken along the lines 3-3.
Figure 4:
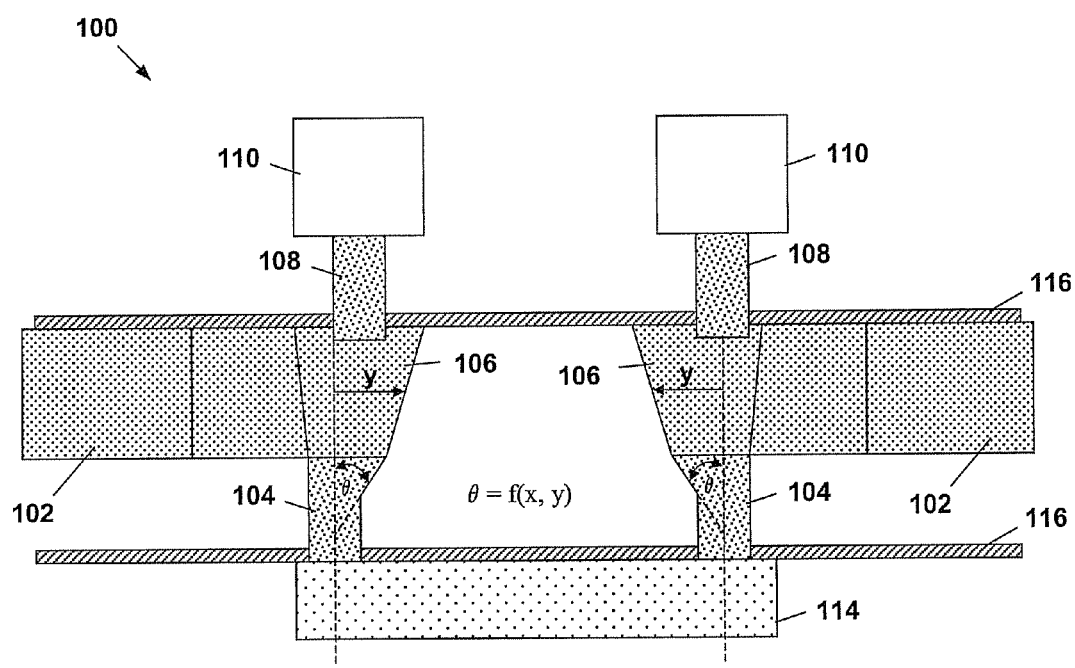
FIG. 4 is another schematic cross-sectional view of the test structure of FIG. 1, taken along the lines 4-4.

Referring initially to FIGS. 1 through 4, there is shown a series of schematic diagrams of a test structure 100 for determining optimal seed and liner layer thicknesses for dual damascene processing, in accordance with an embodiment of the invention. The test structure 100 represents a stacked via structure, in that it encompasses multiple wiring/metal levels (e.g., M1, M2, M3) within an IC device. In particular, FIG. 1 is a schematic top view of the test structure 100, while FIGS. 2 through 4 depict various cross-sectional views of the test structure 100, respectively taken along the lines 2-2, 3-3 and 4-4 in FIG. 1.

As specifically shown in FIG. 1, the test structure 100 includes metal reservoir pads 102 formed at the M2 level of a wafer. The M2 reservoir pads 102 are located a certain distance from a corresponding V1 via 104, and connected thereto through a thinner extended portion 106 of the M2 pad 102. (As used herein, a "V1" via is a via that connects M1 metal to M2 metal, and a "V2" via is a via that connects M2 metal to M3 metal.) The closer the M2 pad 102 is to the corresponding V1 via 104 (i.e., the shorter the extended portion 106 is), the greater the stress migration susceptibility of the test structure. In addition, a V2 via 108 connects the M2 metal (102, 106) with M3 lines 110. In the top view of FIG. 1, the V2 vias 108 substantially overlap the V1 vias 104.

On the M1 level, a pair of M1 lines 112 is formed at opposing sides of the M2 reservoirs 102 and extended portions 106. The M1 lines 112 (also labeled M1(*a*) and M1(*b*) in the figures) are used to detect electrical shorts from either the V1 via 104 or the M2 metal 102, 106. Also formed on the M1 level is another line 114 that connects the pair of V1 vias 104. As best seen in FIGS. 2 through 4, a cap layer 116 is formed over the M1 and M2 levels.

In forming the test structure 100, the location of the V1 via 104 is fixed while either the dimension x or y is varied, wherein x represents the distance from the center of the V1 via to an outer edge of the M2 metal in one direction, while y represents the distance from the center of the V1 via to another outer edge of the M2 metal in a perpendicular direction with respect to x. Both the x and y directions, while orthogonal to one another, are parallel with a top planar surface of the wafer. Varying x or y effectively increases the aspect ratio of the V1 via such that the resulting chamfer angle, $\theta$, is increased, thereby defining chamfer surfaces of the V1 via in the x and y directions. These variations are in turn implemented through reactive ion etch (RIE) lag, where $\theta$ depends on the size of the feature (e.g., M2 metal opening) above the via. The chamfer process thus gives rise to a tapering of the top portion of the V1 via 104. As shown in FIG. 2 and FIG. 3 for example, $\theta$ for one side of the V1 via 104 increases as x increases while it remains unchanged on the other side.

As further shown in FIG. 4, $\theta$ for one side of the via 104 increases as y increases while it remains unchanged on the other side. A larger $\theta$ will effectively increase the step coverage during Cu seed and liner deposition on the opposite sidewall of the V1 via 104. That is, the Cu seed and liner thickness are varied on the V1 sidewall where $\theta$ is fixed while they remain constant on the V1 sidewall where $\theta$ is changed.

It is also possible to measure the leakage currents from V1 to M1 on both sides of the via. As indicated in FIGS. 2 and 3, $I_{Leak1}$ is the leakage current between V1 and M1(*a*) on the side of the via with varying $\theta$ and $I_{Leak2}$ is the leakage current between V1 and M1(*b*) on the side of the via where $\theta$ remains fixed (i.e., a substantially straight sidewall profile). It is expected that $I_{Leak1}$ will increase as $\theta$ increases. Further, $I_{Leak1}$ will increase if the liner is too thin and there is a great deal of bottom trench roughness for the M2 line. As can be seen in FIGS. 2 and 3, $\theta$ depends on x and y (i.e., the geometry of the line openings used in forming the M2 line), and in turn $I_{Leak1}$ depends on $\theta$; however, $I_{Leak2}$ is independent of x and y. Accordingly, chains of test structures having varying values of x or y may be located in different regions of the wafer.

Figure 5:
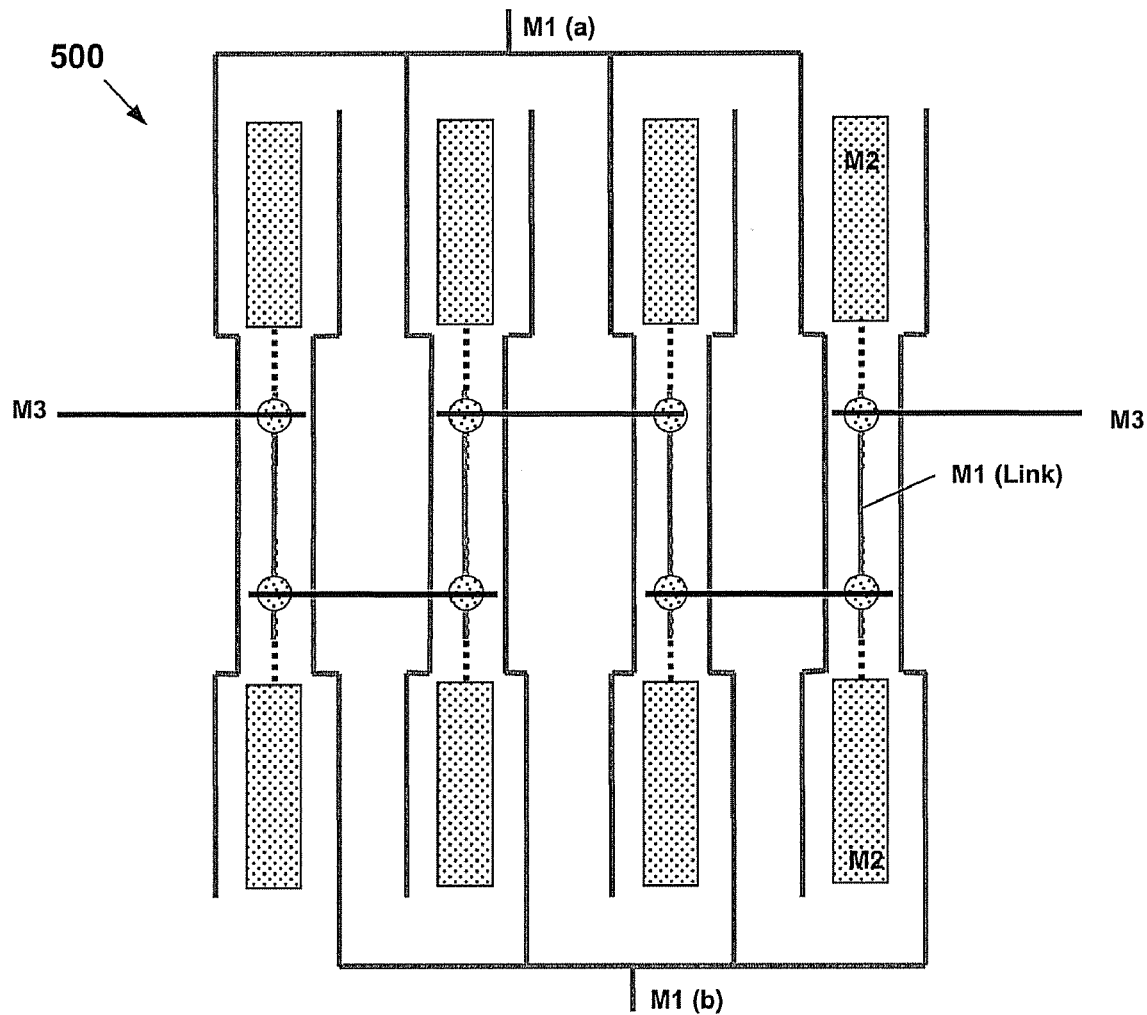
FIG. 5 is a schematic top view of a macro layout of an exemplary test structure chain using the test structure of FIG. 1.

Referring now to FIG. 5, there is shown the layout of an exemplary test structure chain 500 corresponding to one set of x and y values. In the exemplary embodiment depicted, the chain 500 includes four test structures such as illustrated in FIG. 1, with the M3 lines connected in series and the M1(*a*) lines and the M1(*b*) lines connected in parallel. Each test structure chain 500 on a given wafer would comprise a fixed number of vias so that stress migration results can be appropriately compared. Thus, the exemplary chain 500 shown in FIG. 5 may have vias each corresponding to a first set of x, y values (e.g., $x_1$, $y_1$), while an adjacent chain may have vias corresponding to a second set of x, y values (e.g., $x_2$, $y_1$). Still another chain may have vias corresponding to a third set of x, y values (e.g., $x_3$, $y_1$), and so on. For analysis purposes, it is contemplated that varying the chamfer dimension in a single direction (e.g., x or y) is preferable to varying both at the same time. Still another set of chains such as chain 500 can be formed such that x remains the same, but y varies from chain to chain (e.g., [$x_1$, $y_2$], [$x_1$, $y_3$] . . . , etc.).

With respect to testing itself, voiding in the V1 vias is determined by measuring a resistance increase across the structure. The resistance is measured between one end of the chain 500 and the other end of the chain 500 using the M3 taps shown in FIG. 5. Different chains 500 with different x and y via chamfer values would be tested to determine which value of x or y yields the best stress migration results. In addition, the leakage currents between the M1-M3 stress migration structure and the M1(*a*) lines may be measured in-line to determine the point at which $\theta$ becomes so large so as to create a short between the V1 via and the M1 line. Separately, the leakage currents between the M1-M3 stress migration structure and the M1(*b*) line are made to determine a baseline measurement for the case where $\theta$ is fixed. Measurements of the actual Cu seed and liner thicknesses are then obtained from scanning electron microscopy (SEM) or transmission electron microscopy (TEM) cross sections of the structure. Therefore, the stress migration results together with the leakage current measurements will allow the optimum Cu seed and liner thicknesses to be determined.

The disclosed test structure thus allows for the optimum thicknesses for the Cu seed layer and liner to be determined for a given technology. Such optimum values are based on improved stress migration results and in-line measurements of a unique structure designed such that different thicknesses are obtained in various regions of a given chip of the wafer for the same nominal deposition condition. Chains with varying Cu seed and liner thicknesses in the vias are available on each chip of the wafer for comparison. The disclosed structure is designed for determining the optimum Cu seed and liner thicknesses without the need to change the process conditions.

It should be understood at this point (prior to a detailed discussion of chamfer formation) that the test structure embodiments described herein are not limited to a chamfer via process. That is, even if there is no chamfer formation and the via profiles are vertical, the test structure as previously described is still suitable for determining the optimum thickness for the liner and seed layers. This is due to the fact that the size of the feature above the via directly impacts the ability to conformally deposit liner and seed material on the via sidewalls. For example, if the M2 line above the V1 via is made wider, the coverage of the liner and seed on the via sidewalls is increased. For a narrow M2 line above the V1 via, there is a dielectric shadowing effect that results in lower coverage of the deposited layers. Therefore, while a chamfer via process provides further improvements with respect to the liner and seed coverage, the present invention embodiments can still be used to determine the optimum thicknesses without a specific chamfer process by simply varying the width of the line above the via.

Chamfer Formation

The chamfer angle, $\theta$, in the x and y directions is created as a result of the RIE/lithography process and the associated directionality of the RIE etch. Through suitable process adjustments (e.g., gas flows, pressure, bias and ionization power, etc.) of the RIE plasma, the isotropy/anisotropy of the RIE etch will result in a process with a more directional etch (i.e., a smaller value of x and/or y) or a more isotropic etch (i.e., a larger value of x and/or y). Another factor influencing the chamfer angle is the sequence of the line and via RIE.

Etching the lines first and then the vias will generally result in a smaller value of θ than would performing the sequences in the opposite order.

With respect to the effect of the x and y values and the aspect ratio of the vias, the "line-of sight" deposition properties of physical vapor deposition (PVD), as well as the in-situ resputter techniques used to anchor vias in lines below affect the reliability of the structures, and put minimum constraints on the amount of barrier and seed deposition necessary to achieve a reliable structure, as well as the anchoring of the via in the line below.

The key parameters (e.g., x, y) may be varied by shooting the lithographic patterns and different dimensions in a way that could be achieved by fabricating masks with graduated-size versions of the pattern. The etch conditions will then result in different values of x, y, θ on the wafer such as to produce a range of values of x, y, θ. An alternate means of achieving the goal of varying x, y, θ would be to shoot multiple wafers with the same pattern and then perform wafer-split experiments in which the RIE process conditions were varied for different wafers. Through a judicious choice of varied process conditions, the isotropy/directionality characteristics of the RIE etch could be varied in such a way as to yield a series of samples with varying values of x, y, θ. In turn, the desired barrier/seed process window could then be assessed.

Figure 6A:
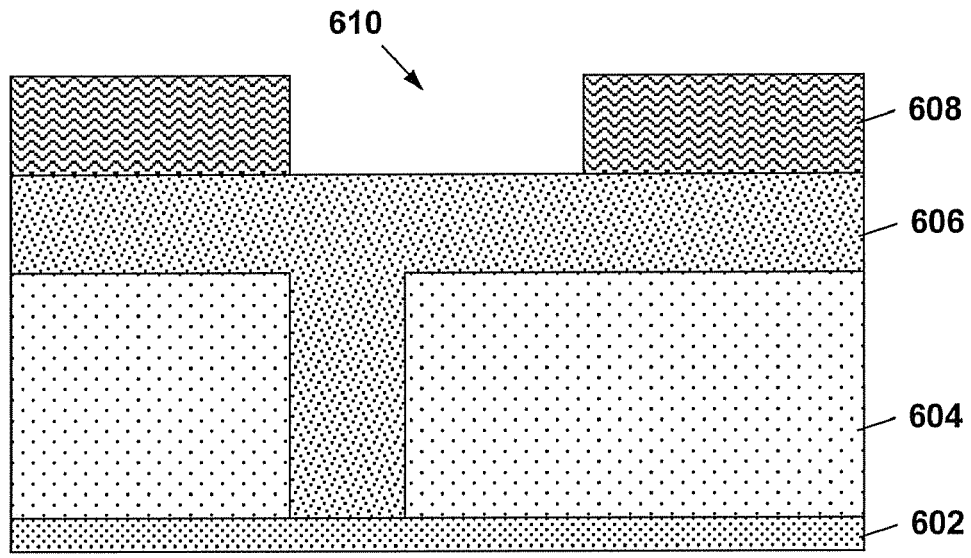
FIGS. 6(a) through 6(e) are process flow diagrams illustrating exemplary method of forming chamfered via openings in accordance with the test structure embodiments.

Referring now to FIGS. 6(a) through 6(e), there are shown a series of process flow diagrams illustrating exemplary method of forming chamfered via openings in accordance with the test structure embodiments. In FIG. 6(a), a metal line 602 has an interlevel dielectric (ILD) layer 604 formed thereupon. The ILD layer 604 is shown with an initial via etch already performed, followed by deposition of a planarizing anti-reflective coating (ARC) fill 606 and a line-level lithography patterning of a photoresist layer 608 to define a line pattern 610, in accordance with dual damascene processing.

Figure 6B:
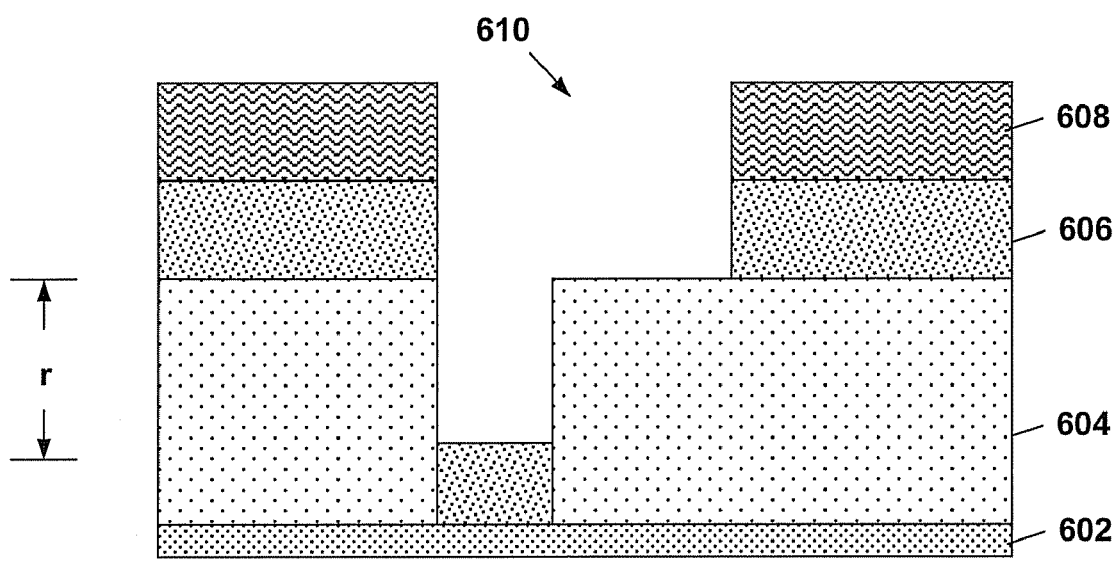
Figure 6C:
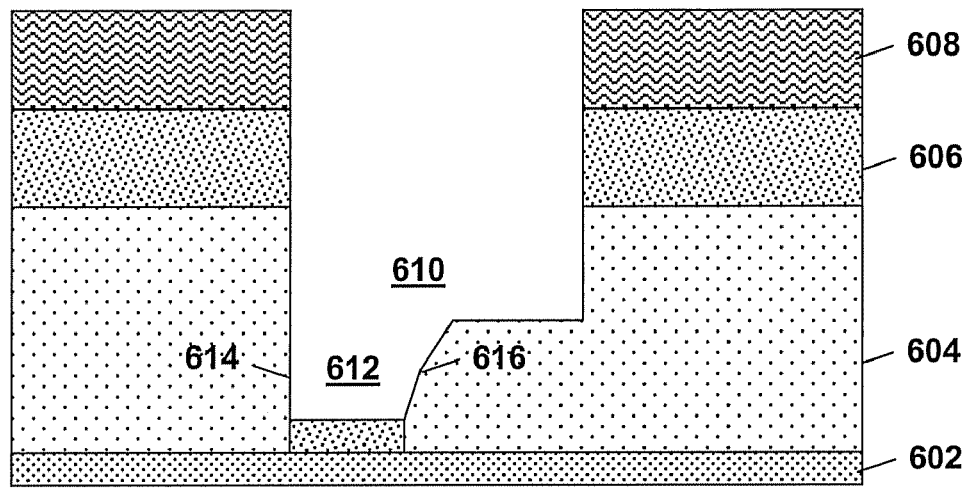

Following the line patterning in the photoresist layer 608, the next process involves line reactive ion etching (RIE), beginning with an ARC open etch. It will be assumed that the ARC open etch process is selective with respect to the ILD layer 604. Depending upon the extent to which the ARC material is recessed from the initial via opening formed in the ILD layer 604, differently dimensioned chamfers may be created. For example, as shown in FIG. 6(b), a relatively deep recess, r, of ARC material leads to a large chamfer angle following etching of the line pattern 610 into the ILD layer 604, as shown in FIG. 6(c). The via opening 612 has a substantially vertical sidewall profile on one side 614 and a chamfered sidewall profile on the opposite side 616.

Figure 6D:
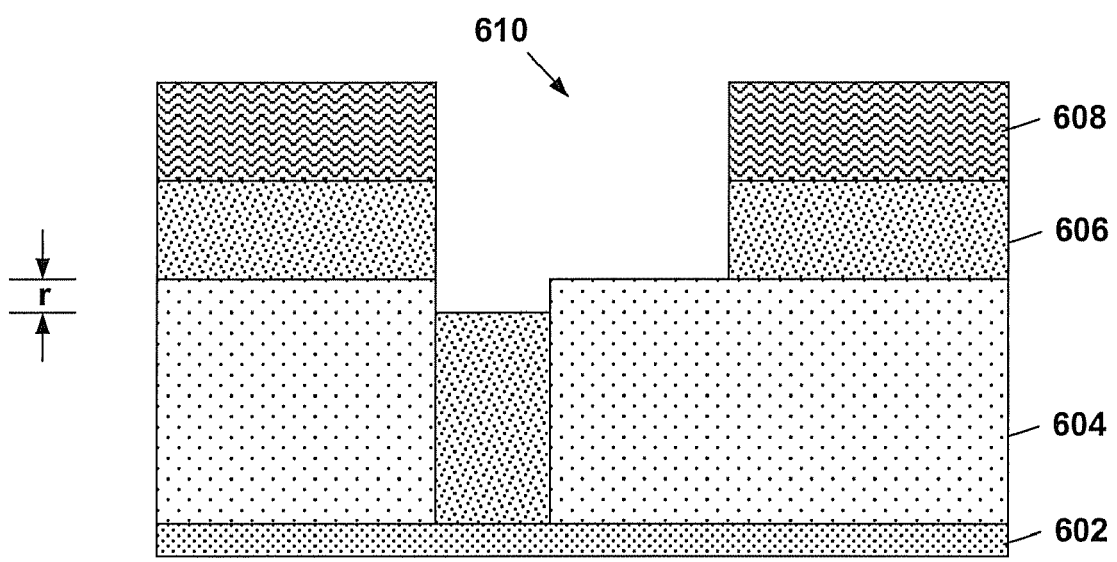
Figure 6E:
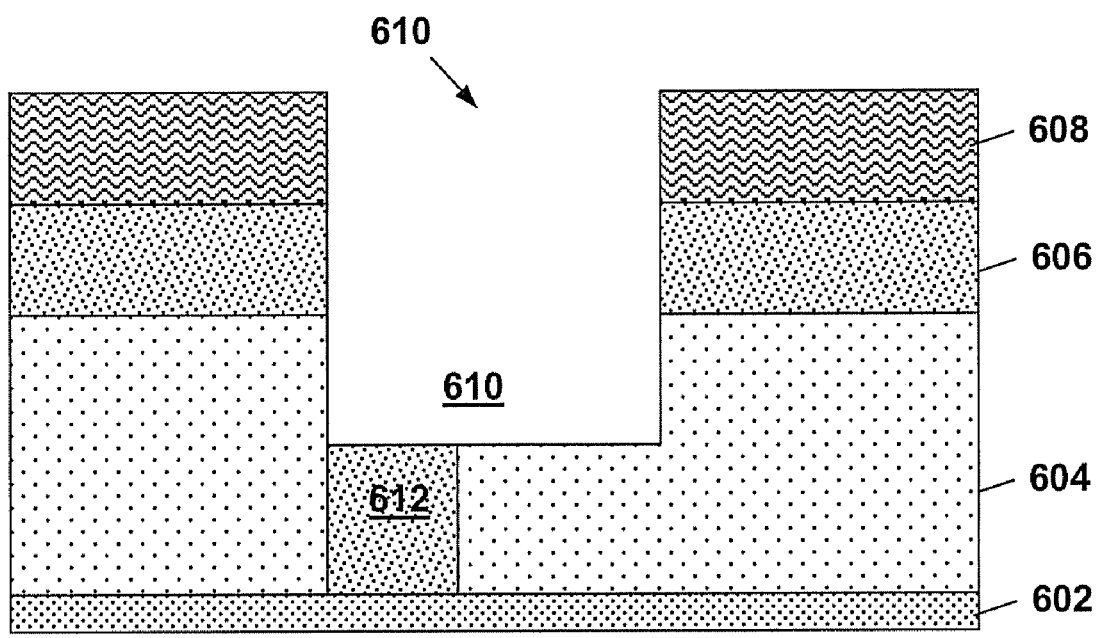

On the other hand, FIG. 6(d) illustrates a relatively shallow recess, r, of ARC material from the initial via opening. Thus, following the line etch of the ILD layer 604 as shown in FIG. 6(e), the chamfer angle is much smaller such that the via opening 612 will have a substantially vertical sidewall profile on both sides.

As indicated above, x and y represent the distances that the M2 line extends past the edge of the V1 via, where x is taken in one direction and y is taken in a perpendicular direction. By increasing x or y, a more tapered via is obtained along these directions, and thus obtain a corresponding increase in the Cu seed and liner thicknesses on the via sidewall that is not tapered. For example, as x increases there is more tapering of the via along this direction, so the via sidewall opposite to this direction will receive better Cu seed and liner coverage. Ultimately, it is the Cu seed and liner thickness along the via sidewall that is varied from chain to chain. For a given process, this is obtained by varying the distance that the M2 line extends past the edge of the V1 via, which in turn changes the tapering and thus the flux of deposited material into the V1 via sidewalls. The larger chamfer, and the concomitant increase in PVD metal flux into the via, will result in thicker copper seed and liner material sidewall coverage during the deposition process.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A test structure for integrated circuit (IC) device fabrication, the structure comprising:

a plurality of test structure chains formed at various regions of an IC wafer, each of the plurality of test structure chains including one or more vias; and each of the one or more vias in contact with a conductive line disposed thereabove, the conductive line being configured such that at least one dimension thereof varies from chain to chain so as to produce variations in seed layer and liner layer thickness from chain to chain for the deposition process conditions, wherein a top portion of each of the one or more vias has at least one chamfer surface at one side thereof and a substantially straight vertical sidewall profile at an opposing side thereof such that a chamfer angle defined by the at least one chamfer surface of the one or more vias varies from chain to chain so as to produce the variations in seed layer and liner layer thickness from chain to chain for the same deposition process conditions.

2. The test structure of claim 1, wherein the at least one chamfer surface comprises a first chamfer surface oriented in a first direction parallel to a planar surface of the IC wafer and a second chamfer surface oriented in a second direction parallel to the planar surface of the IC wafer, the first direction orthogonal to the second direction.

3. The test structure of claim 1, wherein each of the plurality of test structure chains further comprises:

a first metal line formed at a first metal level directly below the one or more vias, and adjacent the one side of the one or more vias corresponding to the at least one chamfer surface; and a second metal line formed at the first metal level directly below the one or more vias, and adjacent the opposite side of the one or more vias corresponding to the substantially straight vertical sidewall profile;

wherein the first and second metal lines are configured to compare leakage currents from the one side of the one or more vias corresponding to the at least one chamfer surface and the opposite side of the one or more vias corresponding to the substantially straight vertical sidewall profile.

4. The test structure of claim 3, wherein the chamfer angle defined by the at least one chamfer surface of the one or more vias is dependent upon the geometry of one or more line openings corresponding to the conductive lines disposed above the one or more vias at a second metal level directly above the one or more vias.

5. The test structure of claim 4, wherein each of the plurality of test structure chains further comprises a pair of metal lines formed at a third metal above the second metal level, the pair of metal lines formed at opposing ends of the chain, wherein the pair of metal lines are configured to implement a series resistance measurement of the one or more vias.

6. The test structure of claim 1, wherein the one or more vias and the conductive line comprise a material selected from the group of: copper (Cu), aluminum (Al), gold (Au), silver (Ag), alloys and combinations thereof.

7. The test structure of claim 1, wherein the liner layer thickness corresponds to a liner layer comprising a material selected from the group of: tantalum (Ta), tantalum nitride (TaN), titanium (Ti), titanium nitride (TiN), tungsten (W), and combinations thereof.

* * * * *